(12) United States Patent
Mai et al.

(10) Patent No.: US 10,403,364 B2
(45) Date of Patent: Sep. 3, 2019

(54) DISTRIBUTED MODE REGISTERS IN MEMORY DEVICES

(71) Applicant: Micron Technology, Inc., Boise, ID (US)

(72) Inventors: Thanh K. Mai, Allen, TX (US); Gary L. Howe, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/110,992

(22) Filed: Aug. 23, 2018

(65) Prior Publication Data

US 2019/0066790 A1 Feb. 28, 2019

Related U.S. Application Data

(63) Continuation of application No. 15/691,217, filed on Aug. 30, 2017, now Pat. No. 10,068,648.

(51) Int. Cl.

| G11C 7/00 | (2006.01) |
| G11C 16/08 | (2006.01) |
| G11C 11/406 | (2006.01) |
| G11C 11/16 | (2006.01) |
| G11C 5/06 | (2006.01) |
| G11C 7/10 | (2006.01) |
| G11C 29/02 | (2006.01) |
| G11C 29/50 | (2006.01) |

(Continued)

(52) U.S. Cl.
CPC .............. *G11C 16/08* (2013.01); *G11C 5/063* (2013.01); *G11C 7/1045* (2013.01); *G11C 11/161* (2013.01); *G11C 11/40603* (2013.01); *G11C 29/025* (2013.01); *G11C 29/028* (2013.01); *G11C 29/50008* (2013.01); *G11C 11/408* (2013.01); *G11C 11/4076* (2013.01)

(58) Field of Classification Search
CPC .. G11C 16/08; G11C 11/161; G11C 11/40603
USPC ..................................................... 365/185.23
See application file for complete search history.

(56) References Cited

U.S. PATENT DOCUMENTS 6,333,888 B1   12/2001  Nakazawa
7,200,062 B2 *  4/2007  Kinsely ................. G11C 11/406
                                                    365/189.14

(Continued)

FOREIGN PATENT DOCUMENTS

WO        2014062543 A2    4/2014

OTHER PUBLICATIONS

PCT International Search Report for PCT Application No. PCT/US2018/029143 dated Aug. 9, 2018; 15 Pages.

*Primary Examiner* — Xiaochun L Chen
(74) *Attorney, Agent, or Firm* — Fletcher Yoder, P.C.

(57) ABSTRACT

A semiconductor device may include a plurality of memory banks, a plurality of mode registers that may control an operational mode associated with each of the plurality of memory banks, and a set of global wiring lines coupled to each of the plurality of mode registers. The set of global wiring lines may include a first global wiring line to transmit data to each of the plurality of mode registers, a second global wiring line to transmit an address signal to each of the plurality of mode registers, a third global wiring line to transmit a read command signal to each of the plurality of mode registers, and a fourth global wiring line to transmit a write command signal to each of the plurality of mode registers.

11 Claims, 3 Drawing Sheets

(51) Int. Cl.
*G11C 11/4076* (2006.01)
*G11C 11/408* (2006.01)

(56) References Cited

U.S. PATENT DOCUMENTS

| | | | |
|---|---|---|---|
| 7,251,171 | B2 | 7/2007 | Nishimura et al. |
| 7,349,277 | B2* | 3/2008 | Kinsley ................ G11C 11/406 365/193 |
| 7,369,445 | B2* | 5/2008 | Lee ..................... G06F 13/1694 365/189.04 |
| 7,984,355 | B2 | 7/2011 | Djordjevic |
| 8,250,295 | B2 | 8/2012 | Amidi et al. |
| 8,649,238 | B2* | 2/2014 | Kim ........................ G11C 8/18 365/230.03 |
| 9,747,230 | B2* | 8/2017 | Han ........................ G11C 5/04 |
| 2005/0024980 | A1* | 2/2005 | Roohparvar ........ G06F 13/1694 365/232 |
| 2006/0044909 | A1* | 3/2006 | Kinsley ................ G11C 11/406 365/222 |
| 2006/0203576 | A1 | 9/2006 | Nishimura et al. |
| 2006/0221748 | A1* | 10/2006 | Kinsley ................ G11C 11/406 365/222 |
| 2007/0126463 | A1 | 6/2007 | Cox et al. |
| 2010/0027358 | A1* | 2/2010 | Lee ..................... G11C 7/1039 365/194 |
| 2010/0138598 | A1 | 6/2010 | Laberge |
| 2011/0242924 | A1* | 10/2011 | Kim ........................ G11C 8/12 365/230.03 |
| 2015/0331817 | A1* | 11/2015 | Han ........................ G11C 5/04 710/308 |
| 2017/0153815 | A1 | 6/2017 | Bauman |
| 2018/0025760 | A1* | 1/2018 | Mazumder ......... H03K 19/1737 365/189.02 |

\* cited by examiner

DISTRIBUTED MODE REGISTERS IN MEMORY DEVICES

CROSS-REFERENCE TO RELATED APPLICATION

This application is a Continuation of U.S. patent application Ser. No. 15/691,217, filed on Aug. 30, 2017, entitled "Distributed Mode Registers In Memory Devices," which is herein incorporated by reference.

BACKGROUND

Field of the Present Disclosure

Embodiments of the present disclosure relate generally to the field of semiconductor devices. More specifically, embodiments of the present disclosure relate to mode registers disposed on a memory die.

Description of Related Art

A semiconductor device, such as a microcomputer, memory, gate array, among others, may include mode registers that may set a parameter representing an operation mode of a channel in the semiconductor device, components within the semiconductor device, and the like. For each individual semiconductor device, the mode registers may be set to different operation modes based on the desired functions of the semiconductor device. To increase the capabilities of the semiconductor devices, additional mode registers may be incorporated into the semiconductor device. Embodiments described herein detail the design and architecture in which the mode registers may be incorporated into a semiconductor device.

BRIEF DESCRIPTION OF DRAWINGS

FIG. 3 illustrates a simplified block diagram of an address decoder that may be part of a mode register within the memory device of FIG. 1, according to an embodiment of the present disclosure;

DETAILED DESCRIPTION

Figure 1:
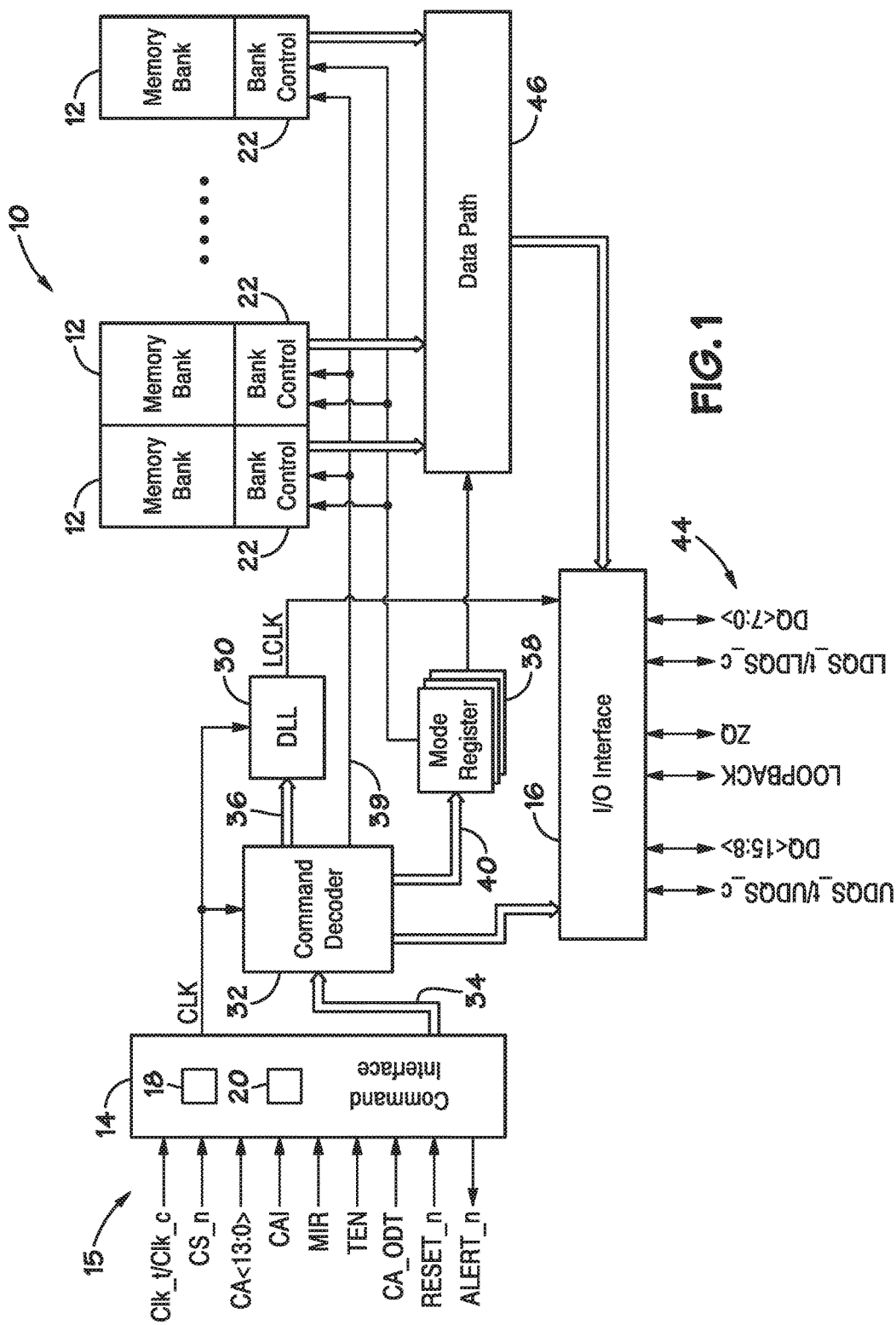
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Mode registers are included in semiconductor devices to define a mode of operation for various types of memory components, such as dynamic random access memory (DRAM), synchronous DRAM, and the like. Certain semiconductor devices may position mode registers at a centralized location or near command/control circuitry of the semiconductor device. This centralized location, however, may be located away from the corresponding memory component being programmed that may be positioned at edges of the semiconductor device. In this case, wiring patterns across the semiconductor device (e.g., die) may become quite intricate.

With this in mind, as more mode registers are incorporated into the semiconductor device, the wiring patterns and structures become more difficult to implement. Indeed, in the fifth generation of the Double Data Rate Synchronous Dynamic Random Access Memory (DDR5) specification, the number of mode registers has increased significantly from previous versions. For example, the number of mode registers in the DDR5 specification has increased to 256 8-bit mode registers from 8 18-bit mode registers, as per the DDR4 specification. The additional mode registers may involve additional wiring across the semiconductor device (e.g., die), such that the mode registers are communicatively coupled to the corresponding memory components.

To better facilitate mode registers in the semiconductor device, in certain embodiments, global wiring lines may be disposed across the length and/or width of the semiconductor device, such that the global wiring lines may be coupled to each of the mode registers of the semiconductor device. The global wiring lines may include a common data path, common address path, a common read control signal path, and a common write control signal path. The global wiring lines may be coupled to each of the mode registers disposed on the semiconductor device. That is, each mode register of the semiconductor device may be coupled to each of the global wiring lines. Indeed, the signals received via the global wiring lines may cause a respective mode register to write data provided via the common data path into its respective memory component and read data stored in its respective memory component out to the common data path based on whether an address provided via the common address path corresponds to the respective mode register. By using the global wiring lines, the mode registers may be arranged in a distributed mode register scheme, such that the mode registers may be adjacent to their respective memory components that they program. Moreover, the distributed mode register scheme allows for an increased number of mode registers to be present on the semiconductor device while reducing the number of wiring lines and patterns on the semiconductor device. Additional details with regard to the distributed mode register scheme will be discussed below with reference to FIGS. 1-5.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization, and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t/) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 39. As will be appreciated, the memory device 10 may include various other decoders, such as row decoders and column decoders, to facilitate access to the memory banks 12. In one embodiment, each memory bank 12 includes a bank control block 22, which provides the necessary decoding (e.g., row decoder and column decoder), as well as other features, such as timing control and data control, to facilitate the execution of commands to and from the memory banks 12.

In certain embodiments, the command decoder 32 or other component in the memory device 10 may provide mode register commands to mode registers 38, which may control an operational mode of each memory bank 12, each bank controller 22, and the like. As will be described in greater detail below, the mode registers 38 may receive various signals from the command decoder 32 or the like via global wiring lines 40. The global wiring lines 40 may include a common data path, a common address path, a common write command signal path, and a common read command signal path. The global wiring lines 40 may traverse across the memory device 10, such that each mode register 38 may couple to the global wiring lines 40 at a respective location.

In addition, the memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal, which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10 based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_c), the data strobe (DQS) signals may be provided as a differential pair of data strobe signals (DQS_t/ and DQS_c) to provide differential pair signaling during reads and writes. For certain memory devices, such as a DDR5 SDRAM memory device, the differential pairs of DQS signals may be divided into upper and lower data strobe signals (e.g., UDQS_t/ and UDQS_c; LDQS_t/ and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description.

Figure 2:
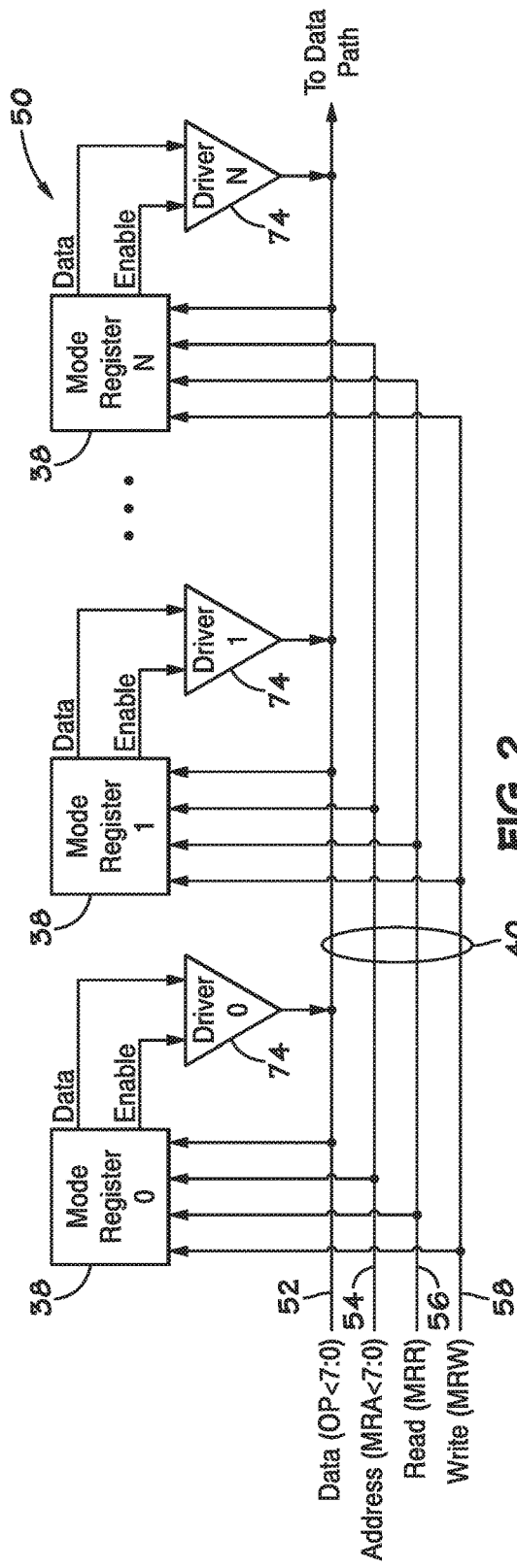
FIG. 2 illustrates a simplified block diagram illustrating a distributed mode register arrangement within the memory device of FIG. 1, according to an embodiment of the present disclosure.

Keeping the foregoing in mind, FIG. 2 illustrates an example of a distributed mode register arrangement 50 that includes a number of mode registers 38 coupled to the global wiring lines 40. As shown in FIG. 2, the global wiring lines 40 may include a common data path 52, a common address path 54, a common read command path 56, and a common write command path 58. The common data path 52 (OP<7:0>) may be a global data path line that traverses across the semiconductor device 10 and that couples to each mode register 38. The data being read from the mode register 38 or written into the mode register 38 may be communicated to the respective mode register 38 via the common data path 52.

In one embodiment, the mode register 38 may perform a read operation based on a read command signal (MRR) received via the common read command path 56 and an address specified in the common address path 54. Like the common data path 52, the common read command path 56 and the common address path 54 (MRA<7:0>) may be coupled to each mode register 38. In response to receiving a read command signal via the common read command path 56, the mode register 38 may determine whether an address received via the common address path 54 corresponds to the respective mode register 38. If the address specified via the common address path 54 corresponds to the respective mode register 38, the mode register 38 may then perform a respective read operation in response to receiving a corresponding read command signal via the common read command path 56. The read operation may involve multiplexing the data stored in the specified address of mode register 38 onto the common data path 52.

In the same manner, the mode register 38 may perform a write operation in response to receiving a write command signal via the write command path 58 (MRW) and an address that corresponds to the respective mode register 38 via the command address path 54. Additional details with regard to causing the mode register 38 to execute a read command or a write command will be discussed below with reference to FIGS. 3 and 4.

Referring first to FIG. 3, in certain embodiments, each mode register 38 may include an address decoder 62. The address decoder 62 may be any suitable logic circuit component that compares a received signal to a reference signal and outputs a signal if the received signal matches the reference signal. In certain embodiments, the address decoder 62 may be part of an address bus. For example, the address decoder 62 may receive an address signal via the common address path 54. If the address signal corresponds to the respective address (e.g., reference signal stored within the address decoder 62) of the respective mode register 38, the address decoder 62 may output a select signal. The select signal may indicate that command signals received via the common read command path 56 or the common write command path 58 are directed to the respective mode register 38. As such, in response to receiving the select signal and a corresponding read or write command signal, the respective mode register 38 may perform the corresponding read or write command.

Figure 4:
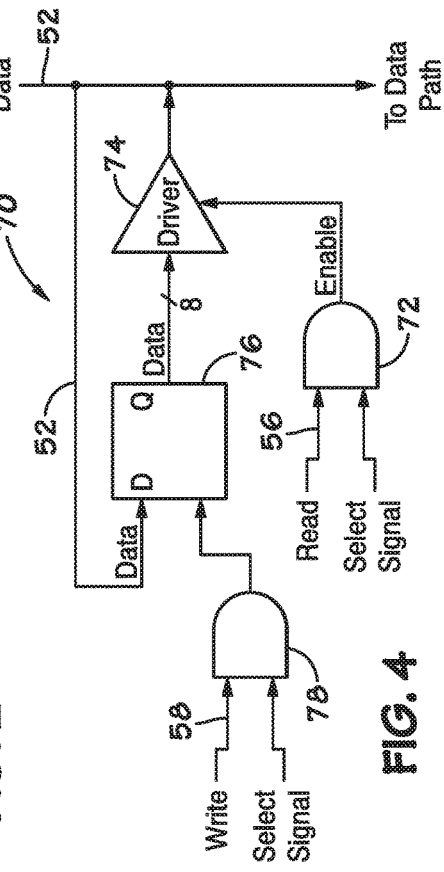
FIG. 4 illustrates an example logic diagram for writing data to or reading data from a mode register within the memory device of FIG. 1, according to an embodiment of the present disclosure.

By way of example, FIG. 4 illustrates a logical block diagram 70 of example logic circuit components that cause the mode register 38 to perform a read command or a write command using the distributed mode register arrangement of FIG. 2. In certain embodiments, the logical circuit components illustrated in FIG. 4 may be incorporated into each mode register 38. Although the following description of the logical block diagram 70 is discussed with reference to certain circuit components, it should be noted that other suitable circuit components may be used to implement similar logic functions described below.

Referring now to FIG. 4, when performing a read command, a respective mode register 38 may receive the select signal output by the respective address decoder 62 at a logical AND gate 72. When the select signal and the read command signal are present (e.g., high), the logical AND gate 72 outputs an enable signal. The enable signal may be provided to a driver circuit 74, which may be a latch circuit or the like. After receiving the enable signal, the driver circuit 74 may read data stored in a gated D-latch 76 out to the common data path 52. The data stored in the gated D-latch 76 may correspond to the data previously written into the respective mode register 38. As such, the mode register 38 performs the read operation in response to receiving the read command signal via the common read command path 56 and an address signal that matches the respective address of the respective mode register 38 via the common address path 54.

In the same manner, when performing a write command, a respective mode register 38 may receive the select signal output by the respective address decoder 62 at a logical AND gate 78. When the select signal and the write command signal are present (e.g., high), the logical AND gate 78 outputs a high signal (e.g., logical 1, pulsed signal) to the gated D-latch circuit 76. In addition to the output of the logical AND gate 78, the gated D-latch circuit 76 may be coupled to the common data path 52. As such, when the gated D-latch circuit 76 receives the high signal, the gated D-latch circuit 76 may write the data present on the common data path 52 into the respective mode register 38. As a result, the mode register 38 performs the write operation in response to receiving the write command signal via the common write command path 58 and an address signal that matches the respective address of the respective mode register 38 via the common address path 54.

Figure 5:
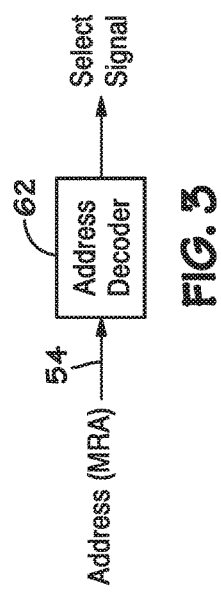
FIG. 5 illustrates a flow chart of a method for writing data to or reading data from a mode register within the memory device of FIG. 1, according to an embodiment of the present disclosure.
Figure 5:
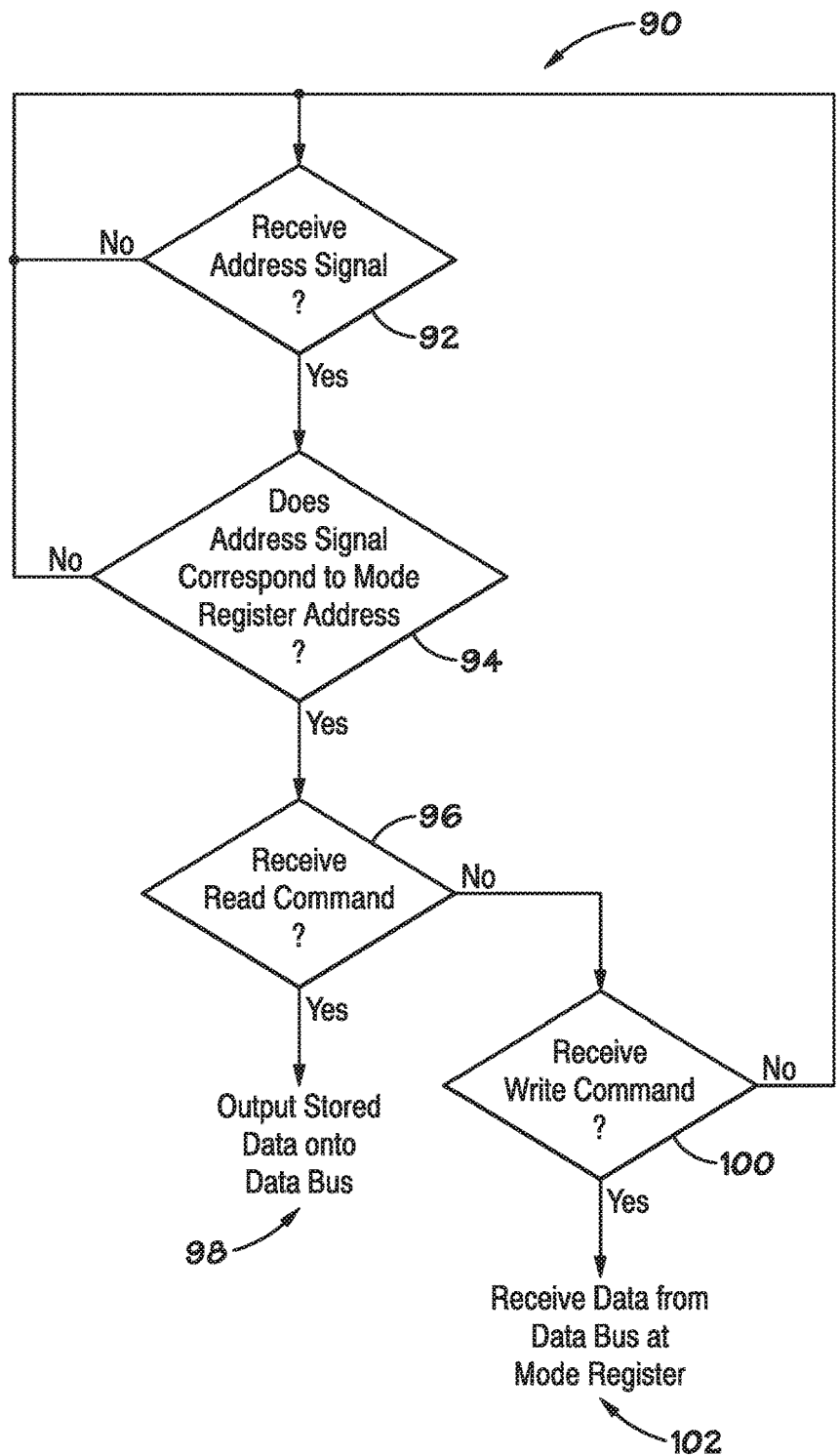

With the foregoing in mind, FIG. 5 illustrates a flow chart of a method 90 for performing a read operation or a write operation in accordance with the embodiments described herein. It should be noted that the method 90 may be performed using the circuit components of FIGS. 3 and 4 or with a processor that is coupled to the global wiring lines 40. That is, the processor may be any suitable processing device that may receive signals, perform logic functions, execute computer-readable code stored on a computer-readable medium, and the like. By way of example, the following description of the method 90 is described as being performed by a processor, but it should be understood that other suitable component (e.g., logical circuit components) may be used to perform the method 90. In addition, although the foregoing description of the method 80 is described in a particular order, it should be noted that the method 80 may be performed in any suitable order.

Referring now to FIG. 5, at block 92, the processor of a particular mode register 38 may determine whether an address signal has been received via the common address path 54. If the address signal has not been received, the processor may return to block 92 and continue monitoring the common address path 54. If the address signal has been received, the processor may proceed to block 94 and determine whether the address signal includes an address that matches the address of the respective mode register 38.

If the address signal does not match the address of the respective mode register 38, the processor may again return to block 92 and continue to monitor the common address path 52. If the address signal does match the address of the respective mode register 38, the processor may proceed to block 96 and determine whether a read command is received via the common read command path 56 along with the address signal via the common address path 54. If the read command signal is present, the processor may proceed to block 98 and output the data stored in the mode register 38 onto the common data path 52. If, however, the read command signal is not present, the processor may proceed to block 100 and determine whether a write command is present on the common write command path 58.

If the write command is present along with the appropriate address signal via the common address path 54, the processor may write the data being transmitted via the common data path 52 into the respective mode register 38. If, at block 100, the write command has not been received, the processor may return to block 92 and continue to monitor the common address path.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A semiconductor device, comprising:
a plurality of mode registers;
a common address path coupled to each of the plurality of mode registers;
a common data path coupled to each of the plurality of mode registers, wherein the plurality of mode registers is configured such that only a respective one of the plurality of mode registers is selected responsive to a respective address signal on the common address path corresponding to the respective one of the plurality of mode registers;
a common read command path coupled to each of the plurality of mode registers;
a common write command path coupled to each of the plurality of mode registers; and
a plurality of AND gates, wherein each AND gate of the plurality of AND gates is configured to receive a read command signal on the common read command path and a respective select signal indicative of the address signal corresponding to the respective one of the plurality of mode registers.

2. The semiconductor device of claim 1, comprising a plurality of driver circuits, wherein each driver circuit of the plurality of driver circuits is configured to output data stored in the respective one of the plurality of mode registers onto the common data path in response to receiving the read command signal on the common read command path and the address signal on the common address path that corresponds to the respective one of the plurality of mode registers.

3. The semiconductor device of claim 1, comprising a plurality of driver circuits, wherein each driver circuit of the plurality of driver circuits is configured to receive an enable signal from a respective AND gate of the plurality of AND gates based on the read command signal and the respective select signal, wherein the enable signal is configured to cause a respective driver circuit to output data stored in the respective one of the plurality of mode registers onto the common data path.

4. The semiconductor device of claim 1, comprising a plurality of circuit components, wherein each circuit component of the plurality of circuit components is configured to write data provided via the common data path into a respective mode register in response to receiving a write command signal on the common write command path and the address signal that corresponds to the respective mode register.

5. The semiconductor device of claim 1, wherein each AND gate of the plurality of AND gates is configured to receive a write command signal on the common write command path and the respective select signal.

6. The semiconductor device of claim 5, comprising a plurality of circuit components, wherein each circuit component of the plurality of circuit components is configured to receive a signal from a respective AND gate of the plurality of AND gates based on the write command signal and the respective select signal, wherein the signal is configured to cause a respective circuit component to store the data provided via the common data path into a respective mode register.

7. The semiconductor device of claim 1, wherein each of the plurality of mode registers comprises an address decoder configured to determine whether the address signal corresponds to the respective one of the plurality of mode register.

8. A method, comprising:
receiving an address signal via a common address path coupled to each of a plurality of mode registers, wherein the address signal is indicative of an address of one of a plurality of mode registers;
receiving a write command via a common write command path coupled to each of the plurality of mode registers, wherein the write command is configured to begin a write operation of the one of the plurality of mode registers;
writing data present on a common data path coupled to each of the plurality of mode registers into the one of the plurality of mode registers in response to receiving the write command and determining that the address of the address signal corresponds to the one of the plurality of mode registers, wherein writing the data into the one of the plurality of mode registers comprises:
generating a signal indicative of a presence of the write command and the address of the address signal corresponding to the one of the plurality of mode registers; and
providing the signal to a circuit component configured to write the data into the one of the plurality of mode registers in response to receiving the signal.

9. The method of claim 8, comprising:
receiving a read command via a common read command path coupled to each of the plurality of mode registers, wherein the read command is configured to begin a read operation of the one of the plurality of mode registers; and
outputting data stored on the one of the plurality of mode registers onto the common data path coupled to each of the mode registers, in response to receiving the read command and determining that the address of the address signal corresponds to the one of the plurality of mode registers.

10. The method of claim 9, wherein outputting the data stored on the one of the plurality of mode registers onto the common data path comprises:
generating a select signal indicative of the address of the address signal corresponding to the one of the plurality of mode registers; and
providing an enable signal to a driver circuit coupled to the one of the plurality of mode registers, wherein the enable signal is configured to cause the driver circuit to output the data onto the common data path.

11. The method of claim 10, wherein the driver circuit is coupled to the common data path and the one of the plurality of mode registers.

* * * * *